United States Patent
Zhang et al.

(10) Patent No.: US 9,653,448 B2
(45) Date of Patent: May 16, 2017

(54) ELECTROSTATIC DISCHARGE (ESD) DIODE IN FINFET TECHNOLOGY

(71) Applicant: Apple Inc., Cupertino, CA (US)

(72) Inventors: Xin Yi Zhang, Cupertino, CA (US); Xiaofeng Fan, Santa Clara, CA (US); Junjun Li, San Jose, CA (US)

(73) Assignee: Apple Inc., Cupertino, CA (US)

( * ) Notice: Subject to any disclaimer, the term of this patent is extended or adjusted under 35 U.S.C. 154(b) by 10 days.

(21) Appl. No.: 14/533,187

(22) Filed: Nov. 5, 2014

(65) Prior Publication Data

US 2016/0020203 A1    Jan. 21, 2016

Related U.S. Application Data

(60) Provisional application No. 62/025,530, filed on Jul. 17, 2014.

(51) Int. Cl.
   *H01L 27/02*     (2006.01)
   *H01L 29/78*     (2006.01)

(52) U.S. Cl.
   CPC ........ *H01L 27/0255* (2013.01); *H01L 29/785* (2013.01)

(58) Field of Classification Search
   CPC ............. H01L 27/0262; H01L 27/0266; H01L 27/0259; H01L 27/0248; H01L 27/0255; H01L 29/785
   See application file for complete search history.

(56) References Cited

U.S. PATENT DOCUMENTS

| | | | |
|---|---|---|---|
| 7,700,449 B2* | 4/2010 | Lee ................. | H01L 21/823431 257/350 |
| 8,592,263 B2 | 11/2013 | Standaert et al. | |
| 8,610,241 B1 | 12/2013 | Hu et al. | |
| 8,890,249 B2* | 11/2014 | Gauthier, Jr. ....... | H01L 27/0629 257/355 |
| 9,236,374 B2* | 1/2016 | Campi, Jr. .......... | H01L 27/0262 |
| 2009/0315112 A1* | 12/2009 | Lee ................. | H01L 21/823431 257/355 |
| 2014/0151808 A1 | 6/2014 | Gauthier, Jr. et al. | |
| 2014/0167815 A1 | 6/2014 | Penzes | |
| 2014/0175551 A1* | 6/2014 | Lin .................. | H01L 21/02518 257/355 |
| 2014/0183641 A1* | 7/2014 | Fan .................. | H01L 29/66136 257/365 |
| 2015/0214211 A1* | 7/2015 | Ma ...................... | H01L 27/0255 257/491 |

* cited by examiner

*Primary Examiner* — Latanya N Crawford
(74) *Attorney, Agent, or Firm* — Meyertons, Hood, Kivlin, Kowert & Goetzel, P.C.; Lawrence J. Merkel

(57) ABSTRACT

In an embodiment, an ESD protection circuit is provided in which diodes may be formed between N+ and P+ diffusions within an insulated semiconductor region and in which additional diodes may be formed between adjacent insulated regions of opposite conduction type as well. The diodes may be used in parallel to form an ESD protection circuit, which may have low on resistance and may sink high ESD current per unit area. To support the formation of the ESD protection circuit, each silicon region may have alternating N+ and P+ diffusions, and adjacent silicon regions may have N+ and P+ diffusions alternating in opposite locations. That is a perpendicular drawn between the N+ diffusions of one adjacent region may intersect P+ diffusions in the other adjacent region, and vice versa.

19 Claims, 3 Drawing Sheets

ELECTROSTATIC DISCHARGE (ESD) DIODE IN FINFET TECHNOLOGY

This application claims benefit of priority to U.S. Provisional Patent Application Ser. No. 62/025,530, filed on Jul. 17, 2014. The above application is incorporated herein by reference in its entirety. To the extent that anything in the incorporated application conflicts with material expressly set forth herein, the material expressly set forth herein controls.

BACKGROUND

Technical Field

Embodiments described herein are related to electrostatic discharge (ESD) protection in integrated circuits.

Description of the Related Art

The transistors and other circuits fabricated in semiconductor substrates are continually being reduced in size as semiconductor fabrication technology advances. Such circuits are also increasingly susceptible to damage from ESD events, thus increasing the importance of the ESD protection implemented in integrated circuits.

Typical ESD protection circuits include diodes that are connected between integrated circuit pin connections and power/ground connections. The diodes are designed to turn on if an ESD event occurs, rapidly discharging the ESD event to avoid damage to the functional circuits (e.g. driver/receiver transistors) that are coupled to the connections. Fin field effect transistor (FinFET) technology further compounds the problem of providing effective ESD protection, because significant silicon volume is lost and thus forming efficient P-N junctions is a challenge. The resistance of the ESD diodes when turned "on" in response to an ESD event is often higher as a result, which reduces the effectiveness of the diodes in responding to ESD events.

One type of diode that can be used in FinFET technology is a "gated diode" or "poly bound" diode. This type of diode is used within a silicon region in which each polysilicon gate defines a boundary between N+ and P+ diffusions. Such diodes present a high capacitive load and high wiring resistance to the narrow pitch of the gates. Another type of diode is used if N+ and P+ diffusions are separated by an insulator such as silicon trench isolation (STI). These diodes are sometimes referred to as STI bound diodes, and typically have lower capacitance and wiring resistance than gated diodes.

SUMMARY

In an embodiment, an ESD protection circuit is provided in which diodes may be formed between N+ and P+ diffusions within an insulated semiconductor region and in which additional diodes may be formed between adjacent insulated regions of opposite conduction type as well. The diodes may be used in parallel to form an ESD protection circuit, which may have low on resistance and may sink high ESD current per unit area. To support the formation of the ESD protection circuit, each silicon region may have alternating N+ and P+ diffusions, and adjacent silicon regions may have N+ and P+ diffusions alternating in opposite locations. That is a perpendicular drawn between the N+ diffusions of one adjacent region may intersect P+ diffusions in the other adjacent region, and vice versa.

BRIEF DESCRIPTION OF THE DRAWINGS

The following detailed description makes reference to the accompanying drawings, which are now briefly described.

Figure 1:
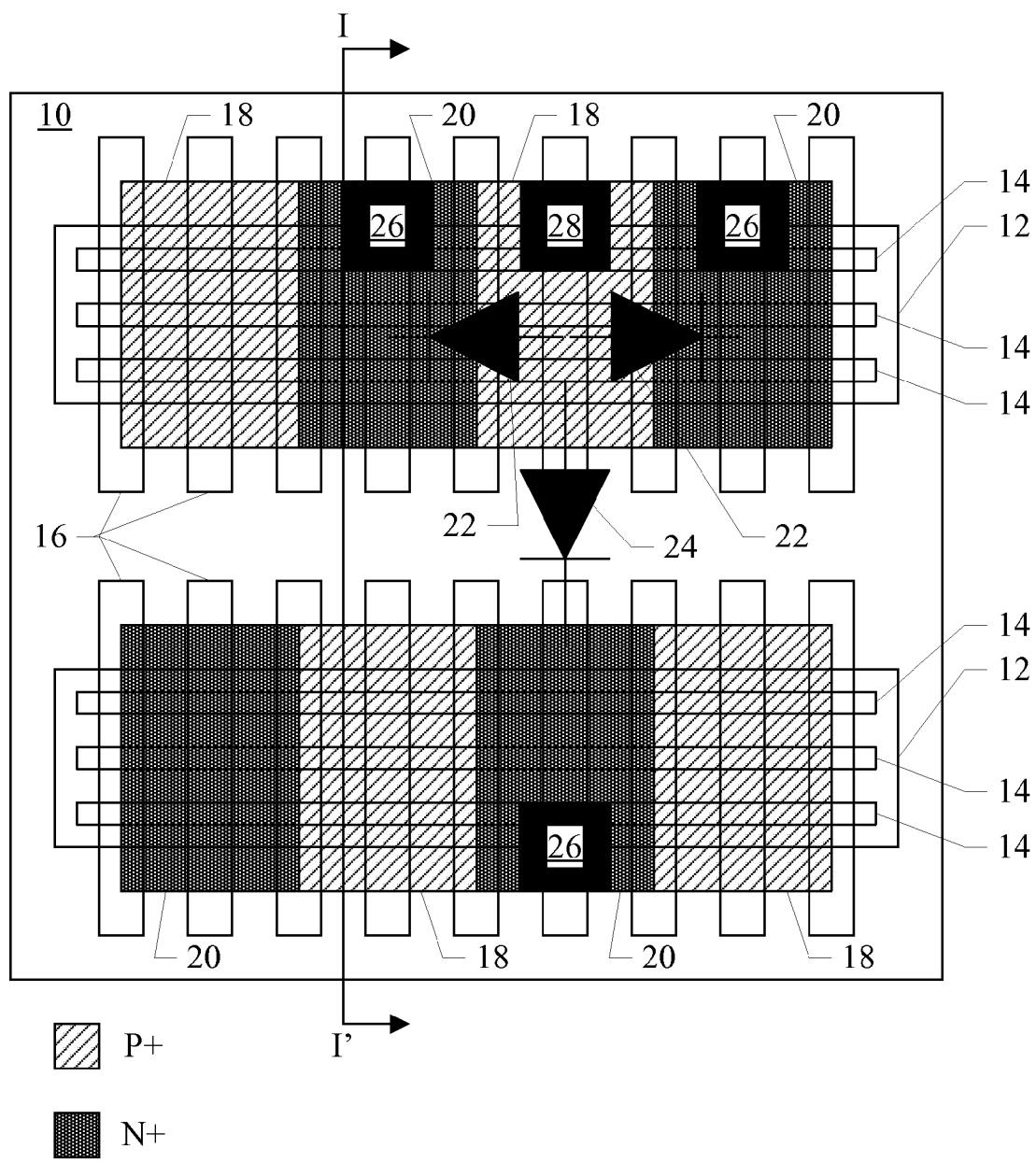
FIG. 1 is a block diagram of one embodiment of a top view of a semiconductor substrate with a diode structure.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

FIG. 1 is a top view of one embodiment of a semiconductor substrate. In the illustrated embodiment, the substrate may be P-type (P). The substrate may include an N-type (N) well 10 formed in the P-type substrate. Other embodiments may have an N-type substrate and may use a P-well, or a dual-well semiconductor fabrication process may be used. Semiconductor regions 12 may be formed within the N-well. In one embodiment, the semiconductor material is silicon. The semiconductor regions may be insulated from each other using any fabrication technique (e.g. shallow trench isolation (STI)). The semiconductor regions 12 may include multiple "fins" 14 in a fin field effect transistor (FinFET) semiconductor fabrication technology. That is, the fins 14 in the semiconductor regions 12 may rise above the surface of the substrate as compared to the well 10, for example. The fins 14 in each region 12 may be parallel to each other and parallel to the fins 14 in other regions 12.

The fins 14 may be doped with impurities to produce highly doped N-type and P-type conduction regions (denoted as N+ and P+). In the illustrated embodiment, cross-hatched areas 18 may represent P+ regions and dot-filled areas 20 may represent N+ regions. The areas 18 and 20 may be the areas over which the dopants may be implanted. The fins 14 may actually be separated by insulators such as STI, and so the actual N+ and P+ regions may be in the fins 14 themselves. The N+ and P+ regions may be constructed in areas of the substrate in which diodes are to be formed (e.g. to form ESD protection diodes). Depending on the FinFET fabrication process, the fins may be further grown into other shapes such as diamond or merged together through a semiconductor epitaxial process step.

Each semiconductor region 12 may have polysilicon "fingers" built thereon. For example, fingers 16 are illustrated in FIG. 1. The fingers may form gates for transistors formed in the fins 14 in areas where transistors are fabricated, for example. While polysilicon is used in the present embodiment, any material that may form a gate structure for transistors may be used.

The border between each P+ and N+ area forms a P/N junction that may operate as a diode. For example, in FIG. 1, diodes 22 are shown at the junctions on both sides of the P+ area 18 to the adjacent N+ areas 20. Furthermore, by reordering the P+ and N+ areas 18 and 20 between adjacent semiconductor regions 12, a diode across the two adjacent semiconductor regions 12 may be formed (e.g. the diode 24 in FIG. 1). Viewed in another way, if a perpendicular were drawn from one semiconductor region 12 to the other, the opposite semiconductor type would be found at each end of the perpendicular (i.e. N+ at one end, P+ at the other). The areas of opposite semiconductor type in two adjacent regions 12 may be aligned to each other, when viewed in the direction perpendicular to the fins 14.

Each of the P+ and N+ areas 18 and 20 may cover at least two adjacent fingers 16. While two adjacent fingers are shown in FIG. 1, other embodiments may cover more than two adjacent fingers or a single finger with the same P+ or N+ area. The actual number of adjacent fingers 16 covered by a given area 18 or 20 may depend on circuit requirements, ESD performance versus area efficiency tradeoffs, etc.

By covering multiple fingers 16 with the same P+ or N+ area, wiring to the areas may be simplified because more space is available. For example, wiring terminals 26 in the N+ areas 20 and wiring terminal 28 in the P+ area 18 are shown in FIG. 1. Furthermore, the wiring capacitance may be lower than would be the case if one finger were covered by each area 18 or 20. Additionally, the on resistance of the diode may be less than would be the case if one finger were covered.

The configuration of FIG. 1 may also provide an efficient diode 24, as most of the semiconductor area forming the diode may be utilized to conduct ESD current during ESD events. In the case of the diode 24 as shown in FIG. 1, the areas may include the P-type area 18 in the semiconductor region 12 at the top of FIG. 1 and the N-type area 20 in the semiconductor region at the bottom of FIG. 1. The diode 24 may be efficient, e.g., as compared to wider STI-bound diodes that may have been implemented previously in which portions of the semiconductor area toward the periphery of each diode do not participate significantly in the current through the diode.

Figure 2:
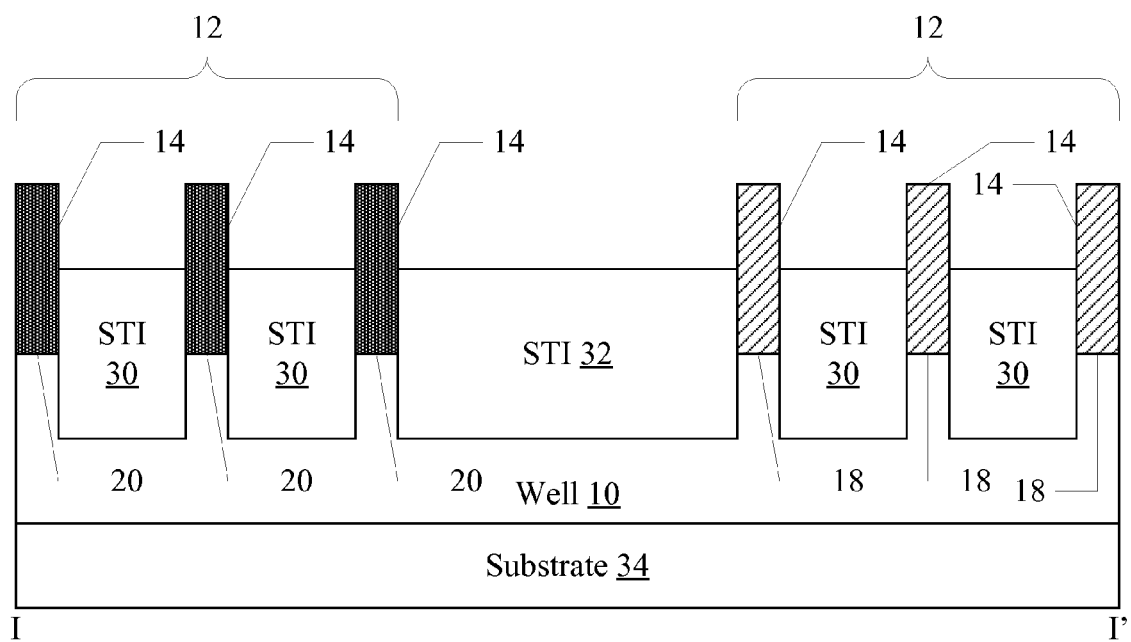
FIG. 2 is a block diagram of one embodiment of a cross section of the semiconductor substrate.

FIG. 2 is a cross section taken along the line I-I' in FIG. 1. The substrate 34 is shown, into which the well 10 is implanted. N+ and P+ areas 18 and 20 are shown, with STI structures 30 separating the fins 12 in each area 18 and 20. Thus, the actually highly-doped areas may be the areas under and in the fins 14. Additionally, an STI structure 32 separates the two semiconductor regions 12, as discussed above. The STI structure 32 may be wider than the structures 30, in an embodiment. Additionally, depths of the structures 30 and 32 may differ.

Figure 3:
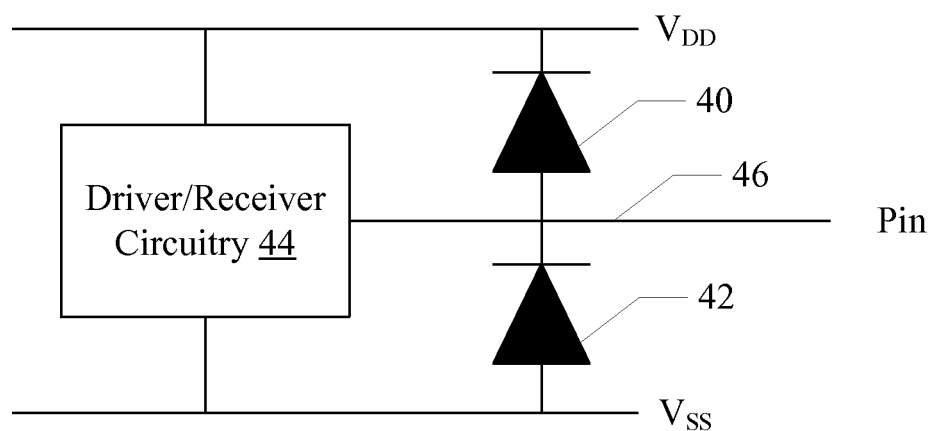
FIG. 3 is a circuit diagram of one embodiment of diodes used for ESD protection in a circuit.

FIG. 3 is a circuit diagram illustrating use of ESD diodes 40 and 42 to protect driver/receiver circuitry 44. The diodes 40 and 42 and the driver/receiver circuit 44 are coupled to a conductor (wire) 46 that makes connection to a pin on a package containing the circuit of FIG. 3. A pin may generally be any external connection point (e.g. a solder ball for packages such as ball grid array, an electrical lead to connect to a through hold on a circuit board, a "leadless" lead to connect to a solder connection on a board, etc.). The pin is an external conductor, and thus may be subject to an ESD event. ESD events may include high voltages and/or currents that would otherwise damage transistors in the driver/receiver circuit 44. The diodes 40 and 42 may be configured to discharge the ESD event to the power and ground ($V_{DD}$ and $V_{SS}$) rails illustrated in FIG. 3.

The diodes 40 and 42 may be formed using the structure illustrated in FIGS. 1 and 2. In the case of diode 40, the wiring terminals 26 may be connected to the $V_{DD}$ rail and the wiring terminal 28 may be connected to the conductor 46. In the case of the diode 42, the wiring terminals 26 may be connected to the conductor 46 and the wiring terminal 28 may be connected to the $V_{SS}$ rail.

The driver/receiver circuitry 44 may include any circuitry to drive and/or receive signals on the pin to which the conductor 46 is connected. If the pin is an output, the circuitry 44 may include driving transistors having source or drain connections to the conductor 46. If the pin is an input, the circuitry 44 may include receiving transistors having gate connections to the conductor 46. If the pin is an input/output pin, the circuitry 44 may include both driving and receiving transistors. The driver/receiver circuitry 44 may include additional ESD protection circuitry (e.g. a voltage clamp circuit).

Numerous variations and modifications will become apparent to those skilled in the art once the above disclosure is fully appreciated. It is intended that the following claims be interpreted to embrace all such variations and modifications.

What is claimed is:

1. A FinFET diode structure comprising:
 a well of a first semiconductor type;
 a first plurality of fins within the well, wherein at least a first fin of the first plurality of fins is implanted in a first area to form the first semiconductor type, and the first fin is implanted in a second area to form a second semiconductor type different from the first semiconductor type, wherein the first area is adjacent to the second area forming a first junction of a first diode and the first fin crosses the first area and the second area; and
 a second plurality of fins within the well, wherein the second plurality of fins are parallel to the first plurality of fins and separated from the first plurality of fins by an isolation structure, wherein at least a second fin of the second plurality of fins is implanted in a third area to form the second semiconductor type, and wherein the first area and the third area form a second junction for a second diode, and wherein, in a view perpendicular to the plurality of fins, the third area is aligned to the first area.

2. The FinFET diode structure as recited in claim 1 wherein a plurality of gates overlay the first plurality of fins, and wherein the first area covers at least two of the plurality of gates.

3. The FinFET diode structure as recited in claim 1 wherein the first diode and the second diode are connected in parallel.

4. The FinFET diode structure as recited in claim 1 wherein at least the first fin is implanted in a fourth area to form the second semiconductor type, wherein the fourth area is adjacent to the first area forming a third diode.

5. The FinFET diode structure as recited in claim 4 wherein the first diode, the second diode, and the third diode are connected in parallel.

6. A diode structure comprising:
a first semiconductor region in a semiconductor substrate, wherein the first semiconductor region includes a first series of areas, wherein adjacent areas in the first series are implanted to form opposite semiconductor types, and wherein a first plurality of fins cross the first series of areas, whereby different areas of each of the first plurality of fins are implanted in each of the first series of areas;
a second semiconductor region in the semiconductor substrate, wherein the second semiconductor region is separated from the first semiconductor region by an insulating region, wherein the second semiconductor region includes a second series of areas, wherein adjacent areas in the second series are implanted to form opposite semiconductor types, and wherein a second plurality of fins cross the second series of areas, whereby different areas of each of the second plurality of fins are implanted in each of the second series of areas; and
wherein an order of the semiconductor types in the first series differs from an order of the semiconductor types in the second series, and wherein diodes are formed between the adjacent areas within the first semiconductor regions, and wherein additional diodes are formed between areas of a first semiconductor type in the first semiconductor region and areas of a second semiconductor type in the second semiconductor region.

7. The diode structure as recited in claim 6 further comprising a well that includes the first semiconductor region and the second semiconductor region.

8. The diode structure as recited in claim 6 wherein, in a view perpendicular to the first plurality of fins and the second plurality of fins, a first area of the first semiconductor type in the first semiconductor region is aligned to a second area of the second semiconductor type in the second semiconductor region.

9. The diode structure as recited in claim 6 wherein a plurality of gates overlay the first semiconductor region, and wherein each area of the first series includes at least two of the gates.

10. The diode structure as recited in claim 9 wherein the plurality of gates are constructed over the first plurality of fins.

11. The diode structure as recited in claim 6 wherein a first diode from the diodes formed between the adjacent areas within the first semiconductor regions and a second diode of the additional diodes are connected in parallel.

12. An electrostatic discharge (ESD) protection circuit comprising:
a first ESD diode circuit coupled between a supply rail and a pin, wherein the first ESD diode circuit includes:
a first diode formed between adjacent areas of opposite type within a first semiconductor region, wherein at least a first fin in the first semiconductor region crosses the adjacent areas of opposite type, and the first ESD diode circuit is formed in the at least the first fin; and
a second diode formed between one of the adjacent areas and a second area in a second semiconductor region that is separated from the first semiconductor region by an insulating structure, wherein the second semiconductor region includes at least a second fin, and wherein the second diode is formed between at least the first fin and at least the second fin, and wherein the first diode and the second diode are in parallel.

13. The ESD protection circuit as recited in claim 12 wherein the first ESD diode circuit further comprises a third diode in parallel with the first diode and the second diode, wherein the third diode shares one of the adjacent areas with the first diode.

14. The ESD protection circuit as recited in claim 13 wherein the third diode is formed between the shared one of the adjacent areas and another area adjacent to the shared one.

15. The ESD protection circuit as recited in claim 12 wherein each of the adjacent areas is at least wide enough to cover two adjacent gate structures in the first semiconductor regions.

16. The ESD protection circuit as recited in claim 15 wherein each of the gate structures comprises a polysilicon finger.

17. The ESD protection circuit as recited in claim 16 wherein the first semiconductor region comprises a plurality of fins including at least the first fin, and wherein the polysilicon finger overlays the plurality of fins.

18. The ESD protection circuit as recited in claim 12 further comprising a second ESD diode circuit coupled between a second supply rail and the pin.

19. The ESD protection circuit as recited in claim 18 wherein the supply rail is a power supply voltage rail and the second supply rail is a ground rail.

* * * * *